(12) United States Patent
Lee et al.

(10) Patent No.: US 8,158,496 B2
(45) Date of Patent: Apr. 17, 2012

(54) METHOD FOR PREPARING COMPOUND SEMICONDUCTOR SUBSTRATE

(75) Inventors: Ho-Jun Lee, Daegu (KR); Yong-Jin Kim, Gyeongsangbuk-Do (KR); Dong-Kun Lee, Gyeongsangbuk-Do (KR); Doo-Soo Kim, Seoul (KR); Ji-Hoon Kim, Gyeonggi-do (KR)

(73) Assignee: Siltron Inc., Gumi-Si, Gyeongsangbuk-Do (KR)

( * ) Notice: Subject to any disclaimer, the term of this patent is extended or adjusted under 35 U.S.C. 154(b) by 61 days.

(21) Appl. No.: 12/878,225

(22) Filed: Sep. 9, 2010

(65) Prior Publication Data

US 2010/0330784 A1  Dec. 30, 2010

Related U.S. Application Data

(62) Division of application No. 12/177,917, filed on Jul. 23, 2008, now Pat. No. 7,816,241.

(30) Foreign Application Priority Data

Oct. 24, 2007 (KR) .................. 10-2007-0107090

(51) Int. Cl.
*H01L 21/28* (2006.01)
(52) U.S. Cl. ........ 438/483; 438/590; 438/602; 438/604; 257/E21.09
(58) Field of Classification Search .............. 438/590, 438/602–604, 607, 29, 69; 257/E21.09
See application file for complete search history.

(56) References Cited

U.S. PATENT DOCUMENTS

| 2002/0013042 A1 | 1/2002 | Morkoc |
| 2002/0197825 A1 | 12/2002 | Usui et al. |
| 2006/0205197 A1 | 9/2006 | Yi et al. |
| 2008/0105881 A1 | 5/2008 | Kim et al. |
| 2008/0272367 A1* | 11/2008 | Cok .............................. 257/40 |
| 2008/0296598 A1* | 12/2008 | Wang et al. ..................... 257/98 |
| 2009/0117675 A1 | 5/2009 | Yamanaka et al. |
| 2010/0047945 A1* | 2/2010 | Derderian et al. .............. 438/29 |

FOREIGN PATENT DOCUMENTS

| EP | 1 921 668 A2 | 5/2008 |
| JP | 2007-19318 A | 1/2007 |
| KR | 2005-0029735 A | 3/2005 |
| KR | 2006-0081108 A | 7/2006 |
| WO | 2007/037504 A1 | 4/2007 |

OTHER PUBLICATIONS

USPTO Office Action mailed Nov. 16, 2006 for U.S. Appl. No. 12/177,917.
USPTO Office Action mailed Dec. 30, 2009 for U.S. Appl. No. 12/177,917.
USPTO Notice of Allowance mailed Jun. 30, 2010 for U.S. Appl. No. 12/177,917.

* cited by examiner

*Primary Examiner* — Thanh Nguyen
(74) *Attorney, Agent, or Firm* — Ladas & Parry LLP

(57) ABSTRACT

Provided is a method for preparing a compound semiconductor substrate. The method includes coating a plurality of spherical balls on a substrate, growing a compound semiconductor epitaxial layer on the substrate coated with the spherical balls while allowing voids to be formed under the spherical balls, and cooling the substrate on which the compound semiconductor epitaxial layer is grown so that the substrate and the compound semiconductor epitaxial layer are self-separated along the voids. The spherical ball treatment can reduce dislocation generations. In addition, because the substrate and the compound semiconductor epitaxial layer are separated through the self-separation, there is no need for laser lift-off process.

5 Claims, 7 Drawing Sheets

METHOD FOR PREPARING COMPOUND SEMICONDUCTOR SUBSTRATE

CROSS-REFERENCE TO RELATED APPLICATION

This application claims priority to Korean Patent Application No. 2007-0107090 filed on Oct. 24, 2007 and all the benefits accruing therefrom under 35 U.S.C. §119, the contents of which are incorporated by reference in their entirety.

BACKGROUND

The present disclosure relates to a compound semiconductor layer formed of gallium nitride (GaN) or a nitride of gallium and other metal, and a method for forming the compound semiconductor layer. The present disclosure also relates to a method for preparing a substrate used in manufacturing of electronic or photo-electronic devices including the compound semiconductor layer. The present disclosure pertains to a technical field for forming a high quality compound semiconductor layer on a substrate, and more particularly, to a technical field for preparing a free standing compound semiconductor substrate by separating the substrate and the compound semiconductor layer.

Semiconductor materials based on nitrides of Group III elements or Group V elements already hold important positions in electronic and photo-electronic fields, which will be important more and more. In fact, the nitride based semiconductor materials may be used in a wide range of fields from laser diodes (LD) to transistors operating at high frequency and high temperature. The nitride based semiconductor materials may also be used in ultraviolet photo-detectors, surface acoustic wave detectors and light emitting diodes.

For example, although gallium nitride is widely known for its usefulness in blue light emitting diodes and high frequency and high temperature transistors, it is also being extensively researched for use in microelectronic devices. As used herein, gallium nitride includes gallium nitride alloys such as aluminum gallium nitride (AlGaN), indium gallium nitride (InGaN) and aluminum indium gallium nitride (AlInGaN).

To grow a gallium nitride layer of low defect density is important in manufacturing gallium nitride microelectronic devices. A substrate on which gallium nitride is grown is known as one cause of the defect. However, it is difficult to prepare a gallium nitride substrate or a substrate for growing gallium nitride without defects. Typical methods such as Czochralski method where the crystal is grown from a melt cannot be used in producing a gallium nitride single crystal for the substrate because gallium nitride is difficult to melt. Surely, gallium nitride can be molten under ultrahigh pressure, however, this is currently unavailable for commercial use due to the low productivity.

Accordingly, in such devices, the most frequently used for growing gallium nitride layer are heterogeneous substrates such as a sapphire substrate, a silicon carbide (SiC) substrate and a silicon substrate. However, because of lattice mismatch and thermal expansion coefficient difference between such substrate materials and gallium nitride, a large number of dislocations may be produced in the gallium nitride layer grown on the substrate, causing crack and bending of the gallium nitride layer. Therefore, a variety of buffer layers are often formed on the substrate before growing the gallium nitride layer thereon, or an epitaxial lateral overgrowth (ELO) method are used to reduce the dislocation generation.

In a typical ELO method, a stripe-shaped silicon dioxide ($SiO_2$) mask is used to reduce stress caused by the lattice mismatch and the thermal expansion coefficient difference between the substrate and the gallium nitride layer. The typical ELO method will be described below with reference to FIG. 1, which is a cross-sectional view of the substrate on which the gallium nitride layer is grown according to the typical ELO method.

In the typical ELO method, the gallium nitride layer 2 is grown on the substrate 1 in a furnace, and then the substrate 1 is taken out of the furnace. The substrate is placed in a deposition apparatus so that silicon dioxide ($SiO_2$) layer is deposited on the gallium nitride layer, and then the substrate 1 is taken out of the deposition apparatus. The silicon dioxide layer is patterned using a photolithography technique to form a silicon dioxide mask 3 on the gallium nitride layer, and then the substrate 1 is placed again in the furnace so that an ELO gallium nitride layer 4 is grown on the gallium nitride layer 2.

A portion of the ELO gallium nitride layer 4 that is laterally grown over the silicon dioxide mask 3 has relatively high quality compared to the portion that is vertically grown. This is because defects such as dislocations cannot propagate through the laterally grown portion. Therefore, by forming a device in the portion of the ELO gallium nitride layer 4 that is laterally grown over the silicon dioxide mask 3, it is possible to obtain an excellent property.

However, the ELO method requires the above described complex process such as an additional external process for forming the silicon dioxide mask, increasing process time and process cost. In addition, recently, as a plurality of silicon dioxide masks are used to improve and enlarge the function of the ELO, the number of the processes for forming the silicon dioxide mask and growing the gallium nitride layer is also increased correspondingly. Consequently, this may result in increased process cost, process complexity, time loss and economical loss, and thus result in decreased process yield.

Korean Patent Laid-Open Publication No. 2004-0078208 discloses, instead of the ELO method, a method for preparing a gallium nitride substrate by forming grooves for reducing contact area between a sapphire substrate and a gallium nitride layer. According to the method, gallium nitride epitaxial layers are grown on an upper surface and a lower surface of the sapphire substrate, respectively. In specific, a first gallium nitride epitaxial layer is grown on the upper surface of the sapphire substrate in a furnace. The sapphire substrate is taken out of the furnace, turned upside down, and then placed in the furnace again so that a second gallium nitride epitaxial layer is grown on the other surface, i.e., the lower surface of the sapphire substrate. Next, a mask patterning is performed on the lower surface using a photolithography process, and the second gallium nitride epitaxial layer is etched to form a plurality of grooves. Thereafter, a laser beam is applied thereto to etch the portion of the first gallium nitride epitaxial layer corresponding to the portion of the plurality of grooves. As a result, the void-like grooves are formed on the upper surface of the sapphire. Using these grooves, a third gallium nitride epitaxial layer is grown.

According to the above described method, the grooves prevent contact of the sapphire substrate and the gallium nitride layer for growing the third gallium nitride epitaxial layer. As such, it is possible to reduce dislocation generations in the gallium nitride layer over the grooves, and reduce crack and bending caused by the thermal expansion coefficient difference as temperature is decreased from a growth temperature to the room temperature. However, the method requires additional processes such as growing the gallium nitride layers on the upper surface and the lower surface of the sapphire substrate, respectively, performing the mask patterning on the gallium nitride layers, and applying the laser beam to form the grooves on the upper surface of the sapphire substrate. This may result in increased process time and process cost.

In addition, when the sapphire substrate is removed after growing the gallium nitride epitaxial layer on the sapphire substrate to use the gallium nitride epitaxial layer as a free standing gallium nitride substrate, the separation of the sapphire substrate from the gallium nitride epitaxial layer needs an additional process such as a laser lift-off. This may also increase the process cost, and decrease the process yield because heat applied to separate the sapphire substrate from the gallium nitride epitaxial layer may cause defects such as crack and bending in the gallium nitride epitaxial layer. If the substrate is formed of silicon, it may be easily removed by a polishing or a chemical etching. However, the silicon substrate also has a limitation that it is difficult to form a high quality gallium nitride epitaxial layer thereon.

As described above, although the mask patterning process for manufacturing the gallium nitride substrate of good quality is effective in reducing dislocations, it may increase process time and process cost.

SUMMARY

The present disclosure provides a simpler and more economical method for preparing a compound semiconductor substrate which is equally or more effective than a typical mask patterning process in reducing dislocations.

According to an exemplary embodiment, a method for preparing a compound semiconductor substrate includes coating a plurality of spherical balls on a substrate, growing a compound semiconductor epitaxial layer on the substrate coated with the spherical balls while allowing voids to be formed under the spherical balls, and cooling the substrate on which the compound semiconductor epitaxial layer is grown so that the substrate and the compound semiconductor epitaxial layer are self-separated along the voids.

The method may further include removing the spherical balls after the cooling of the substrate.

According to another exemplary embodiment, a method for preparing a compound semiconductor substrate includes coating a plurality of spherical balls on a substrate, growing a first compound semiconductor epitaxial layer to a thickness smaller than sizes of the spherical balls on the substrate coated with the spherical balls, forming a plurality of voids by removing the spherical balls from the substrate on which the first compound semiconductor epitaxial layer is grown, growing a second compound semiconductor epitaxial layer on the first compound semiconductor epitaxial layer with the voids, and cooling the substrate on which the first and second compound semiconductor epitaxial layers are grown so that the first compound semiconductor epitaxial layer and the second compound semiconductor epitaxial layer are self-separated along the voids.

The spherical balls may be silica balls, sapphire balls, zirconia balls or yttria-zirconia balls. The compound semiconductor may include gallium nitride (GaN), aluminum nitride (AlN), indium nitride (InN), or a combination $(Ga_{1-x}Al_{1-y}In_{1-z}N$, where $0 \leq x, y, z \leq 1)$ thereof. The substrate may be formed of sapphire $(Al_2O_3)$, silicon carbide (SiC), or silicon (Si).

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
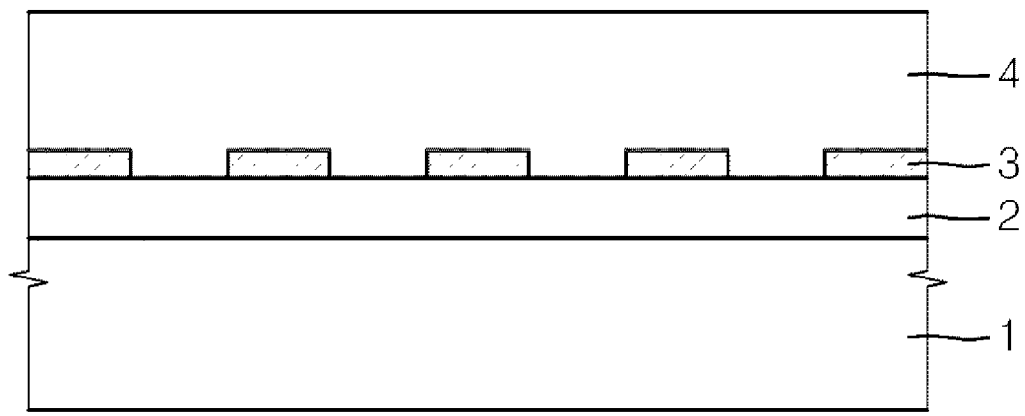
FIG. 1 is a cross-sectional view of a substrate on which a gallium nitride layer is grown according to the typical ELO method.

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, the shapes of elements are exaggerated for clarity of illustration, and like reference numerals refer to like elements throughout. It will be appreciated by those skilled in the art that when an element such as a layer is referred to as being 'on/under' other element herein, it may be directly on/under other element, and one or more intervening elements may also be present.

Embodiments are mainly focused on a spherical ball treatment on a substrate. The spherical ball treatment is equally or more effective than typical mask patterning process in reducing dislocations. In addition, the spherical balls may generate voids between a substrate and a compound semiconductor epitaxial layer so that the substrate and the compound semiconductor epitaxial layer are self-separated along the voids.

Embodiments

FIGS. 2A through 5 illustrate a method for preparing a compound semiconductor substrate according to an exemplary embodiment. FIGS. 2A and 3 through 5 are cross-sectional views and FIG. 2B is a plan view.

Figure 2A:
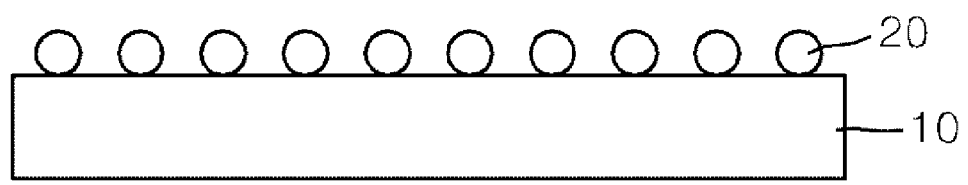
FIGS. 2A through 5 illustrate a method for preparing a compound semiconductor substrate according to an exemplary embodiment.
Figure 2B:
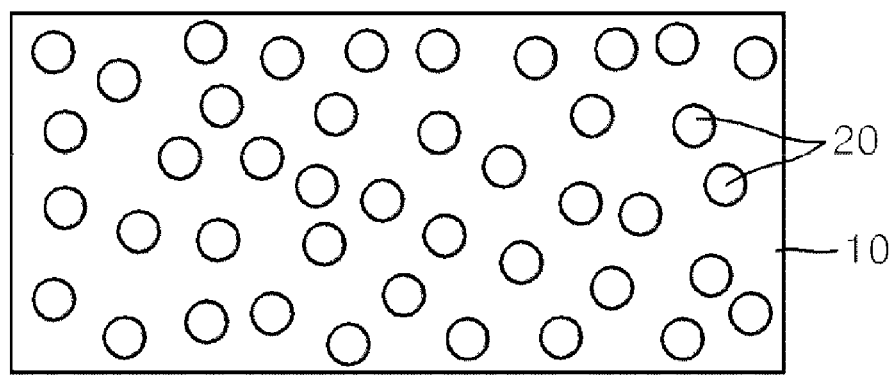

Referring to FIGS. 2A and 2B, a plurality of spherical balls 20 are coated on a substrate 10.

The substrate 10 may be formed of sapphire, silicon carbide (SiC), silicon, or any other typical semiconductor material suitable for growing a compound semiconductor epitaxial layer. For example, the substrate 10 may be formed of a gallium arsenide (GaAs) single crystal, a spinel single crystal, an indium phosphide (InP) single crystal, a silicon carbide (SiC) single crystal, or a gallium nitride (GaN) single crystal. In addition, a buffer layer of gallium nitride (GaN) may be formed on such single crystals. Because all the materials have both strengths and weaknesses, respectively, the material for the substrate can be appropriately selected according to the requirements. For example, when a large area is required, the substrate may be formed of silicon.

The spherical balls 20 may be formed of a metal oxide, such as silica $(SiO_2)$, sapphire $(Al_2O_3)$, zirconia $(ZrO_2)$ and yttria-zirconia $(Y_2O_3—ZrO_2)$. Preferably, the spherical balls 20 may be formed of a material based on a stable oxide that does not react with the substrate 10 and a compound semiconductor epitaxial layer 30 even at a growth temperature of a compound semiconductor epitaxial layer, which will be described later. The spherical balls 20 may be formed of a variety of materials, and may also be obtained commercially.

The spherical balls 20 may have a wide range of size from nanometers to tens of micrometers. In view of size and easiness of manufacturing and removing, the spherical balls are preferably formed of silica. A method for producing the silica balls is described in Korean Patent Application No. 2005-0019605, filed Mar. 9, 2005.

The spherical balls 20 may be coated on the substrate 10 using a simple method such as dropping, dip coating and spin coating, after being dispersed in a suitable solvent. If necessary, drying may be performed to evaporate the solvent. The density of the spherical balls on the substrate 10 may be controlled using the loading density of the spherical balls in the solvent, the thickness of the coating, the number of coatings, and the like.

Figure 3:
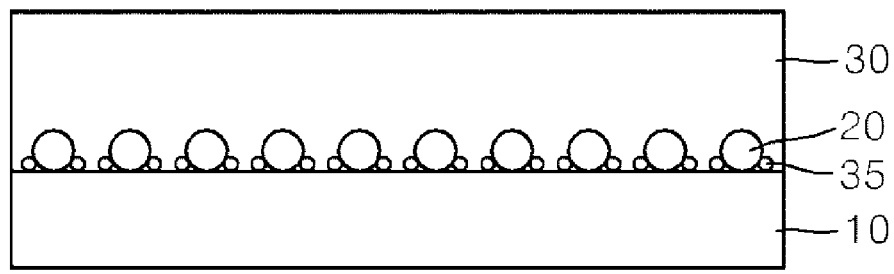
Figure 4:
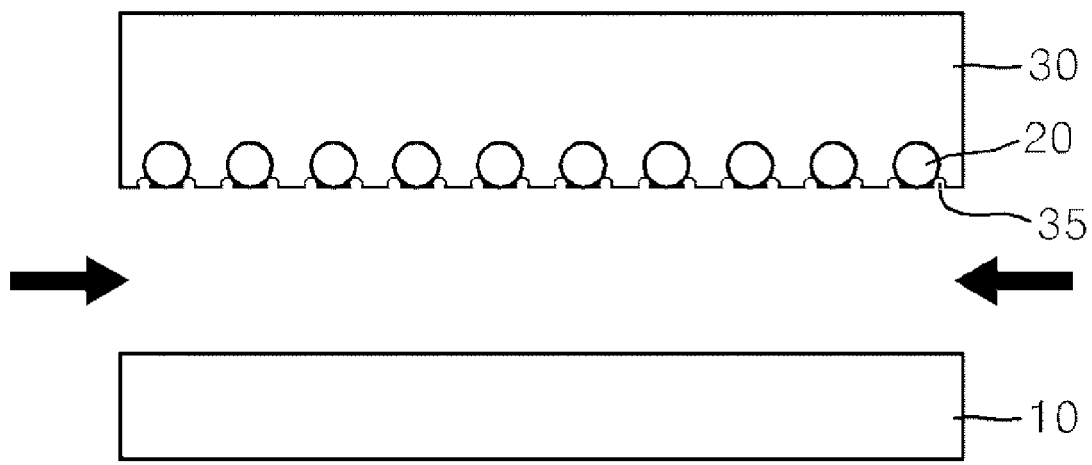

Next, as shown in FIG. 3, the substrate 10 coated with the spherical balls 20 is placed in a furnace so that the compound semiconductor epitaxial layer 30 is grown on the substrate 10. The compound semiconductor epitaxial layer 30 is grown to a thickness greater than the size of the spherical balls 20. That is, the compound semiconductor epitaxial layer 30 is grown to cover the spherical balls 20 completely. The compound semiconductor epitaxial layer 30 is grown to a thickness adequate for the final compound semiconductor substrate.

The compound semiconductor epitaxial layer 30 may be grown using metal-organic chemical vapor deposition (MOCVD), molecular beam epitaxy (MBE), or hydride vapor phase epitaxy (HVPE). The compound semiconductor epitaxial layer 30 may be formed of gallium nitride (GaN), aluminum nitride (AlN), indium nitride (InN), or a combination ($Ga_{1-x}Al_{1-y}In_{1-z}N$, where $0 \leq x, y, z \leq 1$) thereof. That is, the compound semiconductor epitaxial layer 30 may be formed of a gallium nitride alloy such as aluminum gallium nitride (AlGaN), indium gallium nitride (InGaN) and aluminum indium gallium nitride (AlInGaN).

For example, for growing a gallium nitride epitaxial layer using MOCVD, a metal organic (MO) source including gallium (Ga), such as trimethyl gallium (TMGa), triethyl gallium (TEGa) and gallium chloride ($GaCl_3$), and a nitrogen-containing gas, such as nitrogen ($N_2$), ammonia ($NH_3$) and tertiary butyl amine ($N(C_4H_9)H_2$) may be applied to the surface of the substrate 10. For growing a gallium nitride epitaxial layer using HVPE, a vessel containing gallium is placed in the furnace and then heated by a heater around the vessel to melt the gallium. The gallium melt is reacted with hydrogen chloride (HCl) to produce gallium chloride (GaCl) gas. The gallium chloride (GaCl) gas is reacted with ammonia ($NH_3$) to form gallium nitride.

The spherical balls 20 function as the typical mask pattern because they do not cover the whole surface of the substrate 10. That is, nucleation and growth of portions of the compound semiconductor epitaxial layer 30 begin to occur on the exposed upper surface of the substrate 10. Thereafter, due to the epitaxial lateral overgrowth (ELO), the lateral growth fronts coalesce with each other over the spherical balls 20, and then, the compound semiconductor epitaxial layer 30 further extends upwardly. As a result, because of the spherical balls 20, dislocations are bent to thereby improve optical properties and crystallographic properties of the compound semiconductor epitaxial layer 30. In addition, voids 35 are formed under the spherical balls 20.

The compound semiconductor epitaxial layer 30 is grown at a high temperature of approximately 1,000° C. In order to take the substrate 10 on which the compound semiconductor epitaxial layer 30 are grown out of the furnace, the substrate 10 is inevitably cooled down to a lower temperature, e.g. to a room temperature. During the cooling, stress is concentrated at the voids to form brittle interfaces. As a result, the substrate 10 and the compound semiconductor epitaxial layer 30 can be easily separated along the voids 35. Even though they are not completely separated just after the cooling, they are in a state to be easily separated by only a very small mechanical force, e.g., by a worker. As described above, because the substrate 10 and the compound semiconductor epitaxial layer 30 can be separated by the self-separation, an additional laser lift-off process is not required.

Figure 5:

Here, the spherical balls 20 may be separated not only from the compound semiconductor epitaxial layer 30 but also from the substrate 10. However, it is also possible that some of the spherical balls 20 remain on the substrate 10 and the others remain on the compound semiconductor epitaxial layer 30. In addition, it is also possible that all the spherical balls 20 remain on the compound semiconductor epitaxial layer 30. Therefore, in the case where the compound semiconductor epitaxial layer 30 itself is used as a compound semiconductor substrate, there may be a need for removing the spherical balls 20 remaining on the compound semiconductor epitaxial layer 30. The spherical balls 30 can be easily separated or removed using a mechanical method such as ultrasonic cleaning and megasonic cleaning, or a chemical etching because they are not strongly adhere thereto. Specifically, if the spherical balls are made of silica, they can be chemically etched out easily by immersing the compound semiconductor epitaxial layer 30 in a diluent of HF. The surface of the compound semiconductor epitaxial layer 30 is uneven after removing the spherical balls 20. Accordingly, an appropriate polishing may be performed to prepare the final compound semiconductor substrate 30' as shown in FIG. 5. For example, a gallium nitride substrate can be obtained when gallium nitride is grown as the compound semiconductor epitaxial layer 30, and an aluminum nitride substrate can be obtained when aluminum nitride is grown as the compound semiconductor epitaxial layer 30.

As described above, the simple spherical ball treatment can reduce the process time and the process cost as compared to the typical mask patterning process. At the same time, the simple spherical ball treatment can reduce internal generation of linear dislocations during the gallium nitride growth. Furthermore, the separate process for separating the gallium nitride from the substrate can be omitted.

The sequential processes of coating the spherical balls 20 and growing the compound semiconductor epitaxial layer 30 may be performed repeatedly to improve the quality of the compound semiconductor epitaxial layer 30. That is, the coating of the spherical balls 20 and the growing of the compound semiconductor epitaxial layer 30 may be performed once more on the compound semiconductor epitaxial layer 30 of FIG. 3. The multiple layers of the spherical balls 20 can make the dislocations be bent primarily and secondarily in the compound semiconductor epitaxial layer 30.

Figure 6:
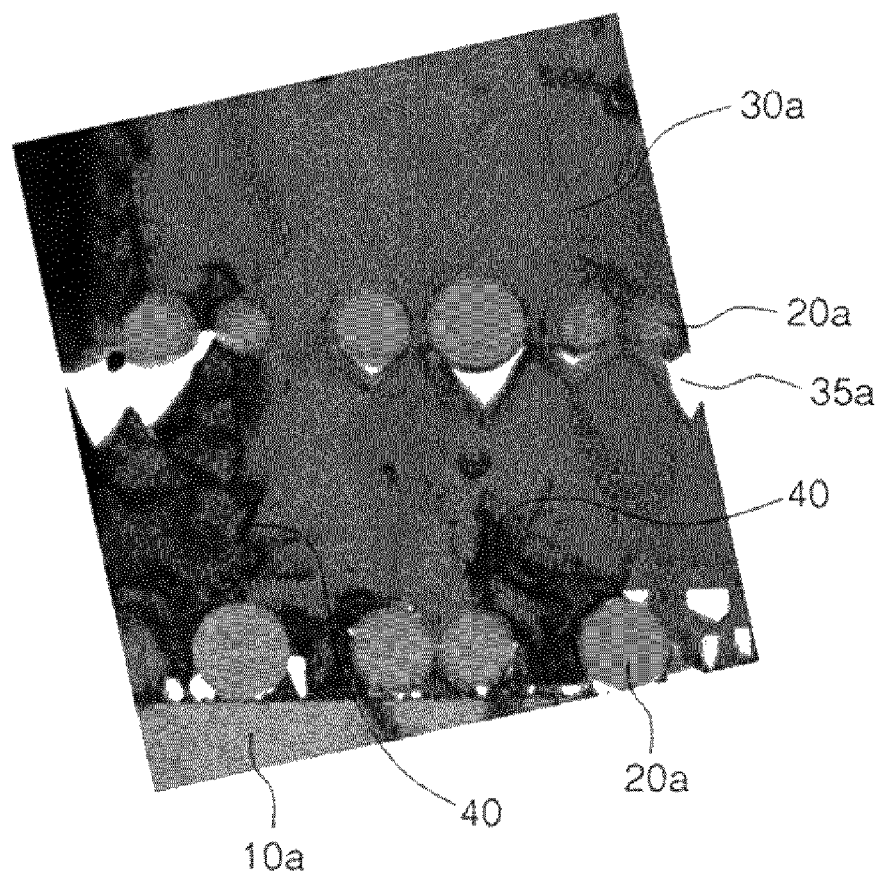
FIG. 6 is a transmission electron microscope (TEM) image of a sample on which a spherical ball coating is performed twice.

FIG. 6 is a transmission electron microscope (TEM) image of a sample on which the spherical ball coating is performed twice. That is, the sample is obtained by coating silica balls 20a on a sapphire substrate 10a, growing a gallium nitride epitaxial layer 30a, coating the silica balls 20a again on the gallium nitride epitaxial layer 30a, and then growing the gallium nitride layer 30a further.

As shown in FIG. 6, voids 35a are formed under the silica balls 20a. Hence, dislocations 40 are bent by the spherical balls 20a, and the sapphire substrate 10a and the gallium nitride epitaxial layer 30a are in a state to be easily separated along the voids 35a.

FIGS. 7A through 10 illustrate a method for preparing a compound semiconductor substrate according to another exemplary embodiment. FIGS. 7A, 8A, 9 and 10 are cross-sectional views, and FIGS. 7B and 8B are scanning electron microscope (SEM) images of upper surfaces of FIGS. 7A and 8A, respectively.

As described above with reference to FIG. 2, a plurality of spherical balls are coated on a substrate 10.

Figure 7A:
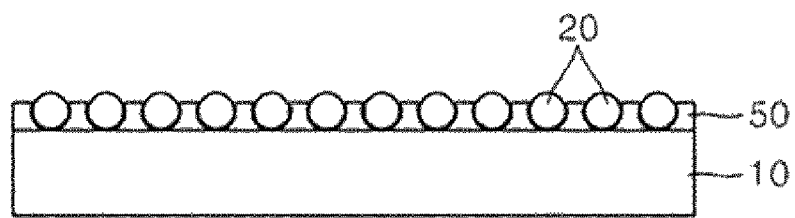
FIGS. 7A through 10 illustrate a method for preparing a compound semiconductor substrate according to another exemplary embodiment.
Figure 7B:
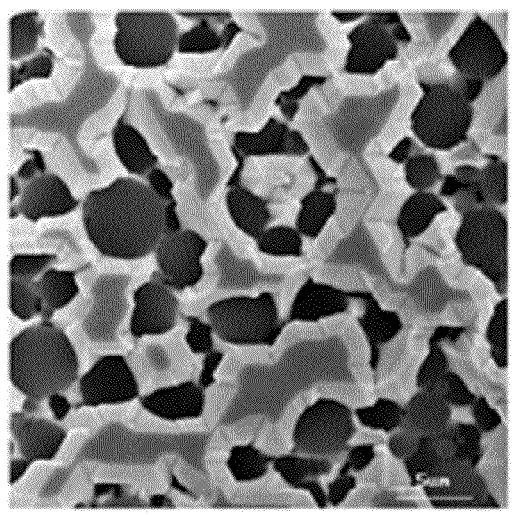

Next, as shown in FIGS. 7A and 7B, the substrate 10 is placed in a furnace so that a first compound semiconductor epitaxial layer 50 is grown on the substrate 10. The first compound semiconductor epitaxial layer 50 is grown to a thickness smaller than the size of the spherical balls 20. That is, the first compound semiconductor epitaxial layer 50 does not completely cover the spherical balls 20 to remove the spherical balls 20 in a subsequent process.

Preferably, the first compound semiconductor epitaxial layer 50 is formed of a chemically stable material, i.e., a material having a crystallographic property identical to or similar to that of a material for a second compound semiconductor epitaxial layer 60 which will be grown in a subsequent process. As such, crystallographic difference and thus a density of crystal defects can be minimized between the first compound semiconductor epitaxial layer 50 and the second compound semiconductor epitaxial layer 60. That is, the first compound semiconductor epitaxial layer 50 is formed of a material having a lattice constant and a thermal expansion coefficient identical to or similar to those of a material for the second compound semiconductor epitaxial layer 60, so that the first compound semiconductor epitaxial layer 50 functions as a buffer layer.

The first compound semiconductor epitaxial layer 50 may be grown using MOCVD, MBE, HVPE, or the like. The first compound semiconductor epitaxial layer 50 may be formed of gallium nitride (GaN), aluminum nitride (AlN), indium nitride (InN), or a combination ($Ga_{1-x}Al_{1-y}In_{1-z}N$, where $0 \leq x, y, z \leq 1$) thereof.

Figure 8A:
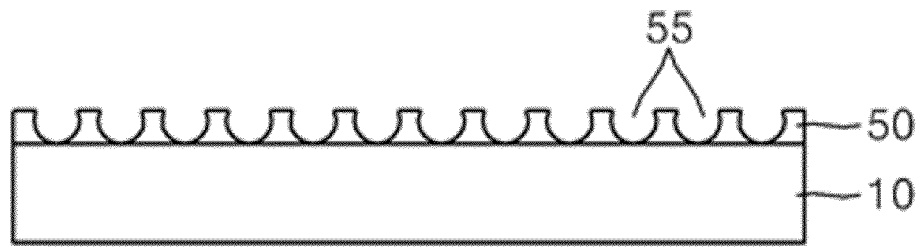
Figure 8B:
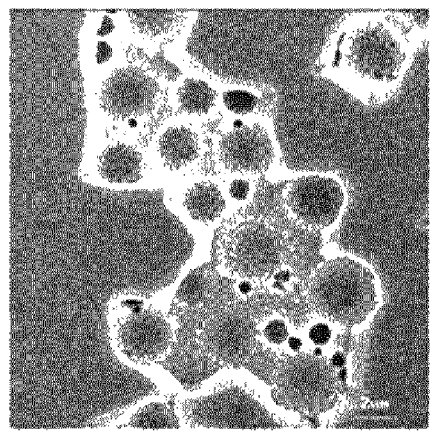

Thereafter, the spherical balls 20 are removed from the substrate 10. As described above, the spherical balls 20 can be easily removed using ultrasonic cleaning, megasonic cleaning, or chemical etching. As shown in FIGS. 8A and 8B, nearly spherical voids 55 are formed where the spherical balls 20 are removed, to expose a portion of the upper surface of the substrate 10. As a result, the first compound semiconductor epitaxial layer 50 with the voids 55 remains on the substrate 10.

Figure 9:
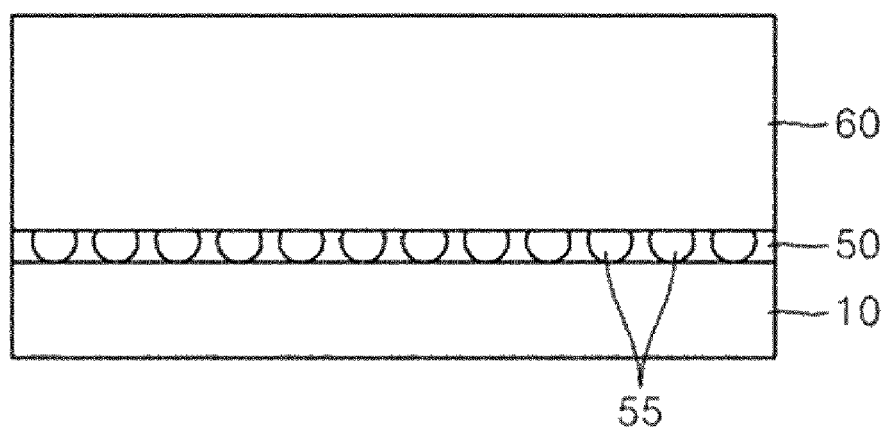

Referring to FIG. 9, the second compound semiconductor epitaxial layer 60 is grown on the first compound semiconductor epitaxial layer 50. The second compound semiconductor epitaxial layer 60 may also be grown using MOCVD, MBE, HVPE, or the like. The second compound semiconductor epitaxial layer 60 may be formed of gallium nitride (GaN), aluminum nitride (AlN), indium nitride (InN), or a combination ($Ga_{1-x}Al_{1-y}In_{1-z}N$, where $0 \leq x, y, z \leq 1$) thereof. The second compound semiconductor epitaxial layer 60 has a suitable thickness to function as a final compound semiconductor substrate.

The second compound semiconductor epitaxial layer 60 grows on the first compound semiconductor epitaxial layer 50 to a desired thickness, and at the same time, the lateral growth fronts coalesce with each other. Resultantly, the continuous second compound semiconductor epitaxial layer 60 is formed on the first compound semiconductor epitaxial layer 50 with a plurality of vacancies, i.e., the plurality of voids 55, therein.

Figure 10:
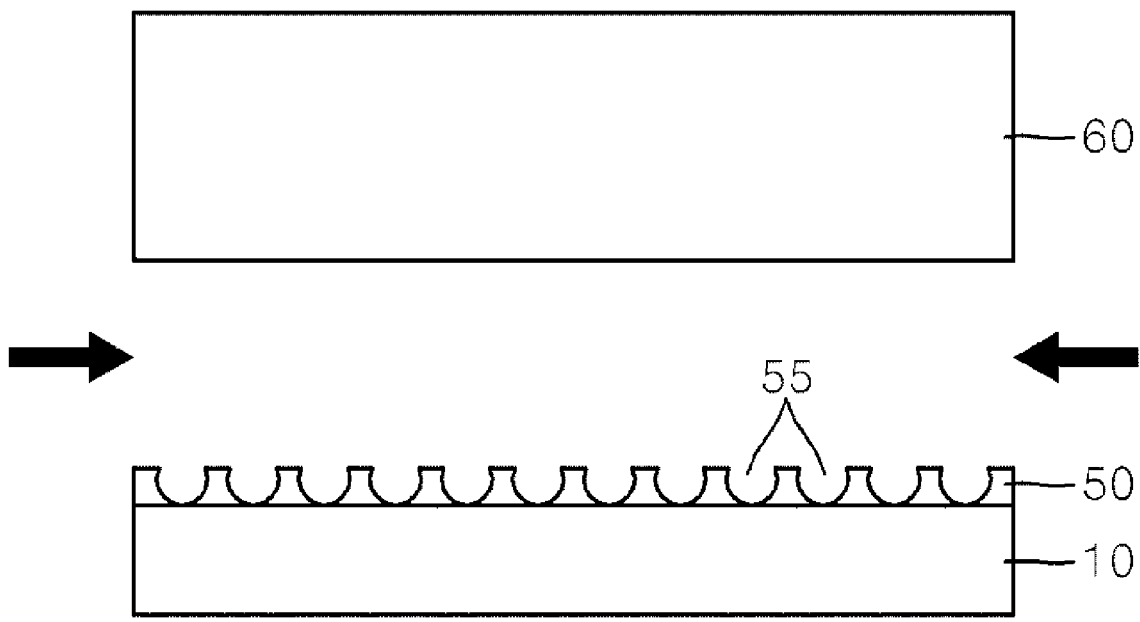

The growth temperature of the second compound semiconductor epitaxial layer 60 is approximately 1,000° C. In order to take the substrate 10 on which the second compound semiconductor epitaxial layer 60 are grown out of the furnace, the substrate 10 is inevitably cooled down to a lower temperature. During the cooling, stress is concentrated at the voids 55 to form brittle interfaces. Consequently, as shown in FIG. 10, the second compound semiconductor epitaxial layer 60 can be separated from the substrate 10 and the first compound semiconductor epitaxial layer 50 along the voids 55. Even though it is not completely separated just after the cooling, it is in a state to be easily separated by only a very small mechanical force. As described above, by separating the second compound semiconductor epitaxial layer 60 through the self-separation, the compound semiconductor substrate can be obtained.

As described above, the spherical balls are coated on the substrate, and the compound semiconductor epitaxial layer is grown thereon. The spherical balls reduce the dislocation generations, increasing the quality of the grown compound semiconductor epitaxial layer. While cooling the compound semiconductor epitaxial layer from the growth temperature, the voids under the spherical balls permit self-separation of the semiconductor epitaxial layer from the substrate. Accordingly, the compound semiconductor substrate of good quality can be prepared without the need of additional separation process such as laser lift-off. As a result, it is possible to reduce the process time and the process cost, and increase the process yield through the simple process, compared to the related art.

Although the method for preparing the compound semiconductor substrate has been described with reference to the specific embodiments, it is not limited thereto. Therefore, it will be readily understood by those skilled in the art that various modifications and changes can be made thereto without departing from the spirit and scope of the present invention defined by the appended claims. In the specification and drawings, there have been set forth exemplary embodiments of the invention which have been included by way of example and not by way of limitation. The scope of the invention is set forth in the accompanying claims and includes all their equivalents and modifications.

What is claimed is:

1. A method for preparing a compound semiconductor substrate, the method comprising:
   coating a plurality of spherical balls on a substrate;
   growing a first compound semiconductor epitaxial layer to a thickness smaller than sizes of the spherical balls on the substrate coated with the spherical balls;
   forming a plurality of voids by removing the spherical balls from the substrate on which the first compound semiconductor epitaxial layer is grown;
   growing a second compound semiconductor epitaxial layer on the first compound semiconductor epitaxial layer with the voids; and
   cooling the substrate on which the first and second compound semiconductor epitaxial layers are grown, so that the first compound semiconductor epitaxial layer and the second compound semiconductor epitaxial layer are self-separated along the voids.

2. The method of claim 1, wherein the spherical balls are silica balls, sapphire balls, zirconia balls or yttria-zirconia balls.

3. The method of claim 1, wherein the spherical balls are silica balls, and removed by a chemical etching.

4. The method of claim 1, wherein the compound semiconductor comprises gallium nitride (GaN), aluminum nitride (AlN), indium nitride (InN), or a combination where ($Ga_{1-x}Al_{1-y}In_{1-z}N$, where $0 \leq x, y, z \leq 1$) thereof.

5. The method of claim 1, wherein the substrate is formed of sapphire ($Al_2O_3$), silicon carbide (SiC), or silicon (Si).

* * * * *